United States Patent [19]
Sato

[11] Patent Number: 6,074,696
[45] Date of Patent: *Jun. 13, 2000

[54] SUBSTRATE PROCESSING METHOD WHICH UTILIZES A ROTARY MEMBER COUPLED TO A SUBSTRATE HOLDER WHICH HOLDS A TARGET SUBSTRATE

[75] Inventor: Yuusuke Sato, Tokyo, Japan

[73] Assignee: Kabushiki Kaisha Toshiba, Kawasaki, Japan

[ * ] Notice: This patent issued on a continued prosecution application filed under 37 CFR 1.53(d), and is subject to the twenty year patent term provisions of 35 U.S.C. 154(a)(2).

[21] Appl. No.: 08/848,242

[22] Filed: Apr. 29, 1997

Related U.S. Application Data

[63] Continuation of application No. 08/528,092, Sep. 14, 1995, abandoned.

[30] Foreign Application Priority Data

Sep. 16, 1994 [JP] Japan ................................. 6-221437

[51] Int. Cl.[7] ................................................. C23C 16/46
[52] U.S. Cl. .................................. 427/248.1; 427/255.5; 216/59
[58] Field of Search ............................ 427/248.1, 255.5; 118/715, 724, 725, 729, 730, 500; 216/59

[56] References Cited

U.S. PATENT DOCUMENTS 5,344,492  9/1994  Sato et al. ........................ 118/725

FOREIGN PATENT DOCUMENTS

| 62-235729 | 10/1987 | Japan . |
| 3-16122 | 1/1991 | Japan . |
| 4-123421 | 4/1992 | Japan . |
| 7-58036 | 3/1995 | Japan . |

*Primary Examiner*—Shrive Beck
*Assistant Examiner*—Timothy Meeks
*Attorney, Agent, or Firm*—Oblon, Spivak, McClelland, Maier & Neustadt, P.C.

[57] ABSTRACT

A substrate processing apparatus includes a processing vessel, a substrate holder, arranged in the processing vessel, for holding a target substrate, a rotary member coupled to the substrate holder and having a hollow portion, at an intermediate portion thereof in an axial direction, with a larger outer diameter than that of a portion thereof coupled to the substrate holder, a bearing portion for rotatably supporting the rotary member, a driving portion for supplying a rotational force to the rotary member, a heating portion for heating the target substrate through the substrate holder, and a cooling portion, arranged in the vicinity of the hollow portion of the rotary member through a small gap, for cooling the hollow portion.

19 Claims, 8 Drawing Sheets

SUBSTRATE PROCESSING METHOD WHICH UTILIZES A ROTARY MEMBER COUPLED TO A SUBSTRATE HOLDER WHICH HOLDS A TARGET SUBSTRATE

This application is a Continuation of application Ser. No. 08/528,092, filed on Sep. 14, 1995, now abandoned.

BACKGROUND OF THE INVENTION

1. Field of the Invention

The present invention relates to a substrate processing method and a substrate processing apparatus for forming a thin film on the surface of a substrate, e.g., a semiconductor wafer, etching the thin film formed on the surface of the substrate and etching the surface of the substrate.

2. Description of the Related Art

As is known well, several methods are available for forming a thin film on the surface of a substrate, e.g., a semiconductor wafer. Vapor-phase growth is one of those methods. Vapor-phase growth utilizes chemical reaction of a source gas at a high temperature, and is advantageous in that, e.g., various types of films can be obtained with a high adhesion strength and film thickness control is comparatively easy. As a substrate processing apparatus for actually forming a thin film on the surface of a substrate, a batch type apparatus that forms films on the surfaces of a plurality of substrates simultaneously is widely used.

In recent years, however, due to an increase in diameter of the semiconductor wafer as the substrate, it is difficult to maintain the film formation uniformity within the surface of the wafer or between wafers with the batch type apparatus. From this reason, in the field of semiconductor element manufacture, a single wafer processing apparatus that forms films on the semiconductor wafers one by one is used more often.

In the single wafer processing apparatus, the film formation rate must be increased to increase the throughput. In order to increase the film formation rate, it is proposed to form a film with an increased film formation temperature while rotating the substrate. More specifically, when the substrate is rotated, the gas in the vicinity of the surface of the substrate can be moved with the centrifugal force, thereby decreasing the thickness of the boundary layer. As a result, the source gas can be easily diffused toward the high-temperature substrate, so that the film formation rate is increased. This operation is effective when etching the thin film formed on the surface of the substrate as well. More specifically, since the diffusion rate of the etching gas toward the high-temperature substrate can be increased, the time required for etching can and the diffusion rate of the product gas from the high temperature substrate be shortened.

In the substrate processing apparatus that rotates the substrate during film formation or etching as described above, a substrate holder arranged in a processing vessel must be rotatably supported by some means, and a rotational drive force must be supplied to this supporting means. The most general way to realize this is to directly couple a rotating shaft to the substrate holder, to support the rotating shaft with a bearing, e.g., a ball bearing, and to supply a rotational force to the rotating shaft from a motor.

In the substrate processing apparatus that rotates the substrate during film formation or etching, the substrate must be held at a high temperature, e.g., 300° to 1,200° C., as described above. Then, heat is transferred from the substrate holder to the bearing or motor through the rotating shaft, thus heating the bearing and motor to a high temperature.

When heat is transferred to the bearing, the temperature of the inner ring becomes higher than that of the outer ring, and the balls present between the inner and outer rings are strongly pushed by the two rings due to the difference in thermal expansion accompanying the difference in temperature. As a result, rotation of the rotating shaft becomes unstable to form non-uniformities in the formed films. In the worst case, it becomes difficult for the substrate holder to hold the substrate and the substrate is thus disengaged from the substrate holder. The bearing and motor use a lubricating oil, a resin material, and the like that normally start to be decomposed when their temperature exceeds 200° C. For example, in the use of even a fonbrin-based lubricating oil having a low vapor pressure, when the temperature exceeds 200° C. the vapor pressure is largely increased. The decomposition products of the lubricating oil, the resin material, and the like largely contaminate the target substrate and, for example, degrades the film quality in film formation.

When the lubricating oil, the resin material, and the like are decomposed along with an increase in temperature, the lubricating oil becomes short or electrical insulation becomes insufficient. Then, a rotational drive mechanism including the bearing is greatly damaged in this regard as well.

In order to eliminate the inconveniences described above, normally, the length of the portion of the rotating shaft from the substrate holder through the bearing is sufficiently increased, so that heat will not be easily transferred to the rotational drive mechanism including the bearing. Then, however, the rotating shaft is supported almost in a cantilever manner. This makes it difficult to obtain stable rotation and increases the number of times of maintenance, leading to a low throughput.

As described above, in the substrate processing apparatus that rotates the substrate during film formation or etching, the target substrate must be held at a high temperature of 300° to 1,200° C. during processing. Thus, heat is transferred from the substrate holder to the rotational drive mechanism including the bearing through the rotating shaft. This heat may cause an erroneous operation of the rotational drive mechanism, or the formed film may be contaminated with the gas generated by the rotational drive mechanism. When the length of the portion of the rotating shaft from the substrate holder through the bearing is sufficiently increased in order to solve this problem, it becomes difficult to obtain stable rotation, the number of times of maintenance is increased, and the throughput cannot be increased.

It is an object of the present invention to provide a substrate processing method and a substrate processing apparatus that can suppress transfer of heat from a substrate holder to a rotational drive mechanism including a bearing through a rotating shaft, thereby preventing occurrence of inconveniences as described above.

SUMMARY OF THE INVENTION

The above object is achieved by a substrate processing method comprising the steps of:

placing a target substrate on a substrate holder in a processing vessel;

rotating a rotary member to hold the target substrate the rotary member being coupled to the substrate holder and having a hollow portion, said hollow portion being provided at an intermediate portion thereof in an axial direction of said rotary member and having a larger outer diameter than a diameter of a portion thereof coupled to the substrate holder;

heating the substrate holder to hold the target substrate;

cooling the hollow portion by cooling means through a small gap, said cooling means arranged in the vicinity of the hollow portion of the rotary member; and introducing a gas into the processing vessel to perform a processing operation to a surface of the target substrate.

The above object is achieved by a substrate processing method comprising the steps of:

placing a target substrate on a substrate holder in a processing vessel;

rotating a rotary member coupled to the substrate holder and having a hollow portion to hold the target substrate;

holding the target substrate;

cooling the rotary member by cooling means through a small gap, said cooling means arranged in an outside of the rotary member; and introducing a gas into the processing vessel to perform a processing operation to a surface of the target substrate, wherein the rotary member and the small gap are set to satisfy:

$$\{\lambda g/(\lambda w \cdot t \cdot \delta)\}^{0.5} > 13 \text{ m}^{-1}$$

where t is a thickness (meters) of the rotary member wall at the hollow portion, $\lambda w$ is a thermal conductivity (W/mK) of the hollow portion of the rotary member, $\delta$ is a distance (meters) of the small gap, and $\lambda g$ is a thermal conductivity (W/mK) of a gas present in the small gap.

The above object is achieved by a substrate processing apparatus comprising:

a processing vessel;

a substrate holder, arranged in the processing vessel, for holding a target substrate;

a rotary member coupled to the substrate holder and having a hollow portion, said hollow portion being provided at an intermediate portion in an axial direction of said rotary member and having a larger outer diameter than a diameter of a portion thereof coupled to the substrate holder;

bearing means for rotatably supporting the rotary member;

driving means for supplying a rotational force to the rotary member;

heating means for heating the target substrate through the substrate holder; and cooling means, arranged in an outside of the hollow portion of the rotary member through a small gap, for cooling the hollow portion through a small gap.

The above object is achieved by a substrate processing apparatus comprising:

a processing vessel;

a substrate holder, arranged in the processing vessel, for holding a target substrate;

a rotary member coupled to the substrate holder and having a hollow portion;

bearing means for rotatably supporting the rotary member;

driving means for supplying a rotational force to the rotary member;

heating means for heating the target substrate through the substrate holder; and cooling means, arranged in an outside of the rotary member through a small gap, for cooling the rotary member through a small gap, wherein the rotary member and the gap are set to satisfy:

$$\{\lambda g/(\lambda w \cdot t \cdot \delta)\}^{0.5} > 13 \text{ m}^{-1}$$

where t is a thickness (meters) of the rotary member wall at hollow portion, $\lambda w$ is a thermal conductivity (W/mK) of the hollow portion of the rotary member, $\delta$ is a distance (meters) of the small gap, and $\lambda g$ is a thermal conductivity (W/mK) of a gas present in the small gap.

In the substrate processing method and the substrate processing apparatus according to the present invention, when the thickness and diameter of the hollow portion of the rotating shaft are appropriately selected, the heat radiating area of the hollow portion can be increased without increasing the length of the rotating shaft in the axial direction and while the heat transfer area of the rotating shaft in the axial direction is decreased. As the cooling means is arranged in the hollow portion having a large heat radiating area to oppose it through the small gap, heat can be absorbed from the hollow portion efficiently.

Assume that a plate having a thickness t meters, a length L meters, an infinitely large width, and a thermal conductivity $\lambda w$ W/mK is placed away from a surface having a temperature Tw W/mK by a distance $\delta$ meters. Assume that a gas having a thermal conductivity $\lambda g$ W/mK is present between the plate and the surface having the temperature Tw W/mK. Suppose that heat radiating from the plate is transferred to the surface having the temperature Tw through the gas. In this case, when the temperature at one end (1=0) of the plate is T0°C., the temperature T° C. at the other end (1=L), which is thermally insulated, is expressed as in the following equation:

$$T = 2(T0 - Tw)/\{\exp(CL) + \exp(-CL)\} + Tw$$

When the temperature Tw of the cooling surface is 25° C., T can be decreased to 200° C. or less as far as $\{\lambda g/(\lambda w \cdot t \cdot \delta)\}^{0.5} = C > 13 \text{ m}^{-1}$ is satisfied.

Additional features can be added to the embodiments discussed above, such as providing an intermediate hollow portion in the rotary shaft or rotary member where the intermediate hollow portion is provided at an intermediate portion in an axial direction of the rotary member and has a larger diameter than a diameter of a portion coupled to the substrate holder, the intermediate hollow portion also has a cylindrical surface, a first end surface and a second end surface, where said surface cooperate so as to define said intermediate hollow portion. Other features include where the wall thickness of the intermediate hollow portion is thinner than other portions of the rotary shaft, and another feature is where the gap between the intermediate hollow portion and the cooling means comprises only one unoccupied gap.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention and, together with the general description given above and the detailed description of the preferred embodiments given below, serve to explain the principles of the invention.

DETAILED DESCRIPTION OF THE PREFERRED EMBODIMENTS

Prior to a description of the preferred embodiments, the principle of the present invention will be explained. In the substrate processing method and the substrate processing apparatus according to the present invention, as a rotating shaft coupled to a substrate holder, a rotating shaft having a large-diameter hollow structure portion at its intermediate portion, or a hollow rotating shaft whose portion coupled with a substrate holder has a larger diameter than that of a target substrate, is employed. A cooling means is provided in the vicinity of the hollow portion of the rotating shaft to oppose it through a small gap, and heat is absorbed from the hollow portion of the rotating s haft by this cooling means through the small gap.

Therefore, when the thickness tm and diameter Rm of the hollow portion of the rotating shaft are appropriately selected, the heat radiating area of the hollow portion can be increased without increasing the length of the rotating shaft in the axial direction and with the heat transfer area of the rotating shaft being decreased in the axial direction. As the cooling means is arranged in the hollow portion having a large heat radiating area to oppose it through the small gap, heat can be absorbed from the hollow portion efficiently.

This cooling mechanism can be modeled in the following manner.

Assume that a plate having a thickness tm, a length Lm, an infinitely large width, and a thermal conductivity $\lambda w$ W/mK is placed away from a surface having a temperature Tw°C. by a distance $\delta m$. Assume that a gas having a thermal conductivity $\lambda g$ W/mK is present between the plate and the surface having the temperature Tw°C. Suppose that heat radiating from the plate is transferred to the surface having the temperature Tw through the gas. In this case, when the temperature at one end (l=0) of the plate is T0, the temperature T°C. at the other end (l=L), which is thermally insulated, is expressed as in the following equation (1):

$$T=2(T0-Tw)/\{\exp(CL)+\exp(-CL)\}+Tw \qquad (1)$$

In this case, the temperature of the rotating shaft can be cooled from 1,000° C. down to 200° C. or less by satisfying the condition of the following equation (2):

$$C=\{\lambda g/(\lambda w \cdot t \cdot \delta)\}^{0.5} \, m^{-1}$$

Although similar modeling is possible with the shape of an actual hollow rotating shaft, merely the equation of C differs a little in this case, and the obtained conclusion is almost identical to that obtained with a flat-plate cooling model.

The temperature of the bearing portion is preferably 200° C. or less even if it is a magnetic bearing. Cooling becomes easy if the length L of the cooling portion is increased. Then, however, the apparatus becomes large in size, and the natural frequency of the rotating shaft is decreased, which is not preferable. Therefore, the actual length of L is supposed to be 0.1 m or less. When the temperature Tw of the cooling surface is 25° C., if the temperature of the rotating shaft is to be decreased from 1,000° C. to 200° C. or less with L=0.1 m, C>13 $m^{-1}$ must be satisfied.

As is seen from the equation of C, the higher the thermal conductivity of the gas, the lower the thermal conductivity of the rotating shaft, the smaller the thickness of the rotating shaft, and the smaller the small gap, then the better the result.

It is preferable that the small gap be as small as possible within a range that the hollow portion of the rotating shaft and the cooling surface are not brought into contact with each other. For this purpose, the gap is preferably about 0.001 m (1 mm). If the gap is 0.005 m (5 mm) or more, the cooling effect is considerably degraded, which is not preferable.

As the gas which is present in the small gap, a gas, e.g., hydrogen, helium, nitrogen, neon, oxygen, and argon, that transfers heat well is preferable. Other gases have low thermal conductivities which are about $\frac{1}{10}$ that of these gases, providing a poor cooling effect.

The rotating shaft is often made of a metal, e.g., an aluminum alloy, stainless steel, molybdenum, and tungsten. As the metal has a high thermal conductivity, the thickness of the hollow portion is decreased, and cooling is performed with a gas having a high thermal conductivity. Regarding the thickness of the hollow portion, it is preferably as small as possible from the viewpoint of cooling of the bearing. However, it is set to about several mm from the viewpoint of the natural frequency of the rotary portion and the strength of the structure of the cooling portion. The rotating shaft can be made of a ceramic, e.g., silica, aluminum oxide, silicon nitride, and carbon. When one of these materials is used, the strength of the rotating shaft, the natural frequency of the rotation system, and the hollow portion are designed in accordance with the natures of the selected materials.

For example, when the hollow rotating shaft made of a 2-mm thick stainless steel plate is cooled by hydrogen gas as the cooling medium with a small gap of 0.001 (1 mm), C is 96 m$^{-1}$, and the bearing portion can be sufficiently cooled to 200° C. or less even with T0=1,000° C. and L=25 mm.

In this manner, since an increase in temperature of the rotational drive mechanism can be suppressed and the length of the rotating shaft in the axial direction need not be increased, stable rotation characteristics can be obtained, and the number of times of maintenance can be decreased, thereby improving the throughput.

When the rotating shaft is formed hollow, a temperature measuring means, e.g., a thermocouple or a radiation temperature, a heating means, e.g., a heater or a lamp, the electrode of the heating means, a means for cooling the rotating shaft, and the like can be arranged in the rotating shaft. When the diameter of the rotating shaft is increased, the rigidity of the rotating shaft can be increased, thereby increasing the natural frequency of the rotation system. When the rotating shaft is formed hollow, the weight of the rotating shaft can be decreased without impairing the rigidity of the rotating shaft very much, thereby decreasing load to the bearing. When the rotating shaft is formed hollow and the thickness of the rotating shaft is decreased, the amount of heat conducted to the bearing and rotational drive mechanism through the rotating shaft can be decreased.

The substrate processing apparatus sometimes uses, as a process gas, a highly corrosive gas or a gas that easily generates particles. When a purge gas is supplied to the area where the bearing and the rotational drive mechanism are arranged, this process gas can be prevented from entering the area where the bearing and rotational drive mechanism are arranged, so that the apparatus can be stably operated over a long period of time.

As described above, in the present invention, a first scheme in which a hollow portion is formed in the intermediate portion of the rotary member in the axial direction to have an outer diameter larger than that of the coupling portion with the substrate holder, and a second scheme in which the rotary member and the small gap are set to satisfy $\{\lambda g/(\lambda w \cdot t \cdot \delta)\}^{0.5} > 13$ m$^{-1}$ are selectively used, thereby improving the cooling characteristics.

As described above, according to the first scheme, the heat radiating area of the hollow portion can be increased without increasing the length in the axial direction while decreasing the heat transfer area in the axial direction. Since the cooling means is arranged in the hollow portion having a large heat radiating area to oppose it through a small gap, heat can be efficiently absorbed from the hollow portion.

According to the second scheme, T can be set to 200° C. or less only when C>13 m$^{-1}$ is satisfied with the temperature Tw of the cooling surface being set to 25° C.

The preferred embodiments of the present invention to which the first and second schemes of the present invention described above are applied will be described.

Figure 1:
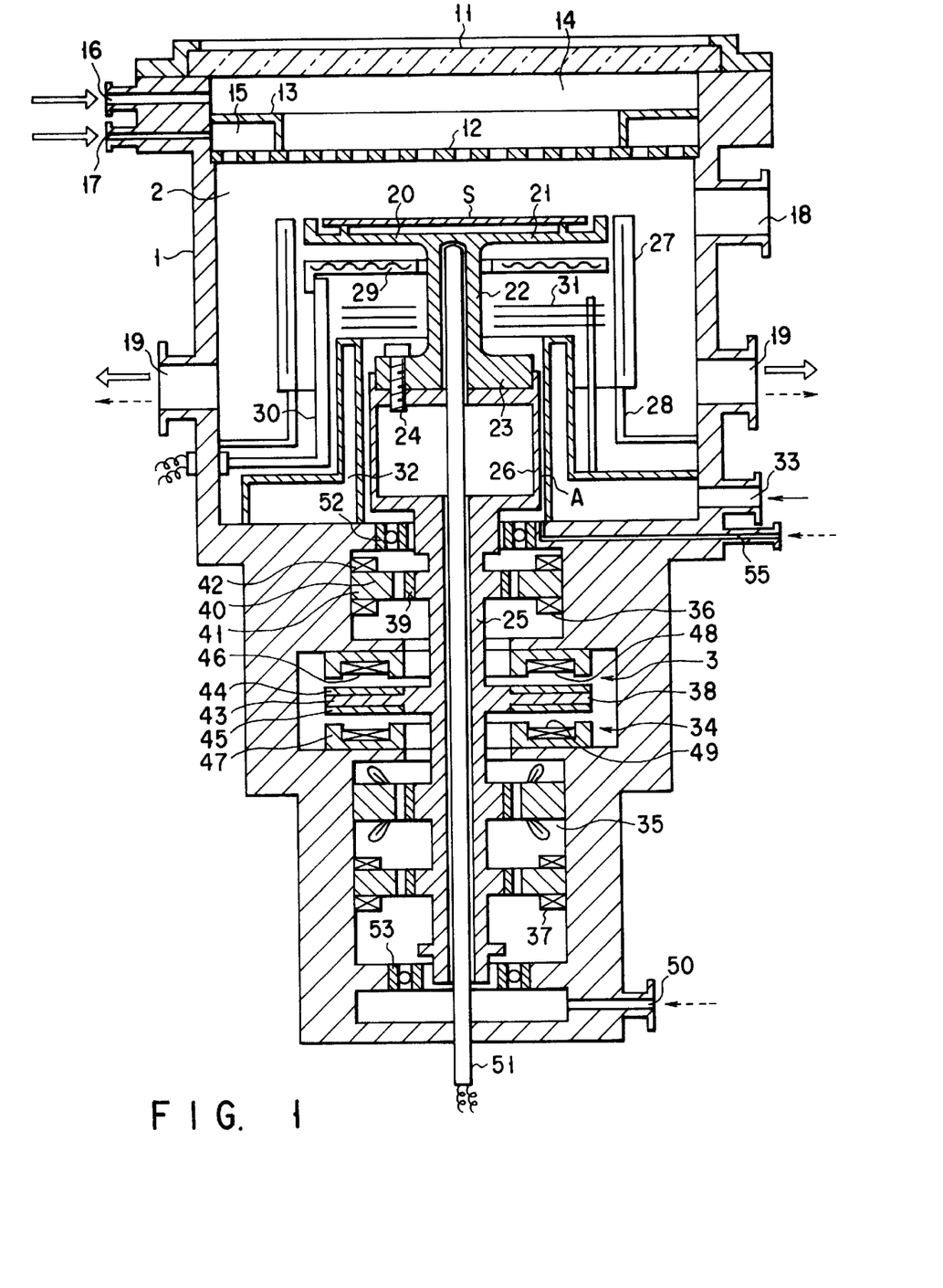
FIG. 1 is a schematic longitudinal sectional view of a substrate processing apparatus according to an embodiment of the present invention.

The substrate processing apparatus shown in FIG. 1 according to an embodiment of the present invention is a single wafer type substrate processing apparatus.

FIG. 1 shows a processing vessel 1. Although the processing vessel 1 is actually constituted by a combination of several parts, FIG. 1 shows the processing vessel 1 as an integral body for the sake of illustrative convenience.

A processing chamber 2 is formed in the upper portion of the processing vessel 1, and an accommodating space 3 for accommodating a magnetic bearing 34 to be described later and a motor 35 serving as a rotational drive mechanism is formed in the lower portion of the processing vessel 1.

An upper wall 11 of the processing chamber 2 is made of a transparent member, e.g., a quartz plate. A radiation thermometer or the like (not shown) is arranged above the upper wall 11. A straightening plate 12 made of a heat-resistant transparent member, e.g., a quartz plate, is arranged at a portion in the processing chamber 2 that opposes the upper wall 11. An annular partition plate 13 is arranged on the circumferential edge portion of the upper surface of the straightening plate 12. The space between the straightening plate 12 and the upper wall 11 is divided into a source gas supply chamber 14 and a purge gas supply chamber 15 by the partition plate 13. The source gas supply chamber 14 is selectively connected to a source gas supply source (not shown) through a source gas inlet port 16, and the purge gas supply chamber 15 is selectively connected to a purge gas supply source (not shown) through a purge gas inlet port 17.

A loading/unloading port 18 for loading or unloading a target substrate S (to be described later) into or from the processing chamber 2 therethrough is formed in an upper portion of the side wall of the processing chamber 2. The loading/unloading port 18 is closed with a valve (not shown) except when loading/unloading the target substrate S. A plurality of discharge ports 19 for discharging the source gas and purge gas that have passed through the processing chamber 2 are formed in a lower portion of the side wall of the processing chamber 2 in the circumferential direction.

A substrate holder 20 for holding the substrate S is arranged in the processing chamber 2 at a position above the central portion of the processing chamber 2. The substrate holder 20 is made of a carbon-based material so that it can suppress the amount of generated gas and that it can withstand a high-temperature atmosphere or a corrosive atmosphere. In this embodiment, the substrate holder 20 is formed of a substrate holder body 21, a shaft portion 22 extending cylindrically downward from the central portion of the lower surface of the substrate holder body 21, and a flange portion 23 integrally formed on the lower end of the shaft portion 22. The flange portion 23 is coupled to the upper end portion of a rotating shaft 25 through a screw 24. As is seen from this structure, the shaft portion 22 and the flange portion 23 constitute part of the rotating shaft 25.

The rotating shaft 25 is made of, e.g., stainless steel and, although it is actually constituted by a combination of several parts, FIG. 1 shows the rotating shaft 25 as an integral body for the sake of illustrative convenience. The rotating shaft 25 is hollow, and a hollow large-diameter portion 26 is formed at a coupling portion of the rotating shaft 25 with the flange portion 23. The hollow large-diameter portion 26 has a larger diameter than that of the shaft portion 22. For example, the hollow large-diameter portion 26 has an axial length of 0.025 m (25 mm), an inner diameter of 0.028 m (28 mm), and a thickness of the circumferential wall of 0.002 m (2 mm). The lower end side of the rotating shaft 25 extends into the accommodating space 3.

A heat-insulating cylinder 27 is arranged around the substrate holder 20, and the heat-insulating cylinder 27 is fixed to the side wall of the processing chamber 2 through a support member 28. An electric heater 29 serving as the heating source is arranged below the substrate holder 20 to be close to the substrate holder 20. The electric heater 29 is fixed to the side wall of the processing chamber 2 with a support member 30 serving also as a power supply path. A power supply wire to the electric heater 29 is guided to the outside of the processing chamber 2 in an insulated state. A heat-insulating plate 31 is arranged between the electric heater 29 and the flange portion 23.

A coolant channel 32 is arranged around the hollow large-diameter portion 26 formed on the rotating shaft 25 to oppose it through a small gap A of about 1 mm. Cooling water of about 25° C. is supplied to the coolant channel 32 through an inlet port 33, and is discharged through a discharge port (not shown).

A purge gas inlet port 55 for flowing a purge gas into the small gap A, formed between the hollow large-diameter portion 26 and the coolant channel 32, is formed in the so-called bottom wall of the processing chamber 2. A gas having a high thermal conductivity, e.g., hydrogen, helium, nitrogen, neon, oxygen, or argon, is supplied into the small gap A through the purge gas inlet port 55. The above list of gases exhibiting a high thermal conductivity is not an exhaustive list. To enhance the convective mode of heat transfer, it is known to employ gases having a high or large value of thermal conductivity, where a large value of thermal conductivity is advantageous as compared to a lower value of thermal conductivity.

The magnetic bearing 34 and the motor 35 are arranged in the accommodating space 3. The magnetic bearing 34 supports the rotating shaft 25 with an element being provided to the rotating shaft 25 in a non-contact manner. The motor 35 supplies a rotational force to the rotating shaft 25 in a non-contact manner.

The magnetic bearing 34 is formed as a five-axis control type magnetic bearing consisting of radial bearings 36 and 37 and a thrust bearing 38. Each of the radial bearings 36 and 37 is constituted by a magnetic ring 39, a stationary yoke 41, and control coils 42. The magnetic ring 39 is mounted on the outer circumference of the rotating shaft 25. The stationary yoke 41 is fixed around the magnetic ring 39 and obtained by providing four magnetic poles 40 equidistantly in the circumferential direction. The control coils 42 are mounted on the respective magnetic poles 40.

The thrust bearing 38 is constituted by a flange portion 43, annular magnetic plates 44 and 45, stationary yokes 46 and 47, and control coils 48 and 49. The flange portion 43 is provided to the rotating shaft 25. The magnetic plates 44 and 45 are fixed to the upper and lower surfaces of the flange portion 43. The stationary yokes 46 and 47 are fixed to oppose the magnetic plates 44 and 45, respectively, and have U-shaped sections. The control coils 48 and 49 are mounted on the stationary yokes 46 and 47, respectively.

The current to the control coils 42, 48, and 49 of the radial bearings 36 and 37 and thrust bearing 38 is controlled by a control unit (not shown) that receives a displacement signal detected by a sensor (not shown), thereby realizing complete non-contact support both in the radial and thrust directions. The control method of the control unit is known, and a detailed description thereof will be omitted.

A purge gas inlet port 50 is formed in the lower wall of the accommodating space 3 to flow the purge gas, e.g., hydrogen, helium, nitrogen, neon, oxygen, or argon, into the accommodating space 3, so that the process gas entering the accommodating space 3 is purged by the inert purge gas.

In FIG. 1, reference numeral 51 denotes a thermocouple, and 52 and 53, touch-down bearings. The thermocouple 51 is inserted into the rotating shaft 25 and into the shaft portion 22 of the substrate holder 20 in a non-contact manner to be close to the proximal end of the shaft portion 22, and is used for measuring the temperature of the substrate holder 20 (target substrate S). The touch-down bearings 52 and 53 preliminarily support the rotary portion while the magnetic bearing 34 is not actuated.

In this embodiment, a purge gas inlet port 55 is provided so that a sufficient amount of purge gas flows into the small gap A between the hollow large-diameter portion 26 and the coolant channel 32.

An example of use of the substrate processing apparatus having the above arrangement, i.e., a case wherein a semiconductor wafer is employed as the target substrate S and a silicon thin film is to be formed on the semiconductor wafer by vapor-phase growth, will be described.

First, cooling water is continuously flowed into the coolant channel 32 as indicated by a solid arrow in FIG. 1. The magnetic bearing 34 is actuated to support the rotary portion in the complete non-contact manner.

Hydrogen gas is continuously flowed into the processing chamber 2 through the gas inlet port 16, 17, and hydrogen as the purge gas is continuously supplied into the processing chamber 2 through the purge gas inlet ports 50 and 55 as indicated by broken arrows in FIG. 1, so that the pressure in the processing chamber 2 reaches a predetermined value.

The motor 35 is driven to rotate the substrate holder 20 (target substrate S) at a predetermined rotation speed. Subsequently, the electric heater 29 is energized to control the substrate holder 20 (target substrate S) to a predetermined temperature. The temperature is measured by the thermocouple 51 or the radiation thermometer (not shown).

In this state, silane gas and hydrogen gas supply the inlet port 16, thus starting film formation.

At this time, part of the heat generated by the electric heater 29 is to be transferred to the accommodating space 3 through the shaft portion 22 of the substrate holder 20 and the hollow large-diameter portion 26 of the rotating shaft 25. However, as the coolant channel 32 is closely arranged around the hollow large-diameter portion 26 through the small gap A, the hollow large-diameter portion 26 is deprived of heat conducted to it by the cooling water flowing in the coolant channel 32 because of convection and radiation of the purge gas flowing in the small gap A.

Therefore, even if the temperature of the target substrate S is 1,000° C., a portion of the rotating shaft 25 located in the accommodating space 3 is constantly maintained at 200° C. or less. The magnetic bearing 34 and the motor 35 are not thermally influenced and can always be operated stably. When the temperature of the target substrate S is about 300° C., a portion of the rotating shaft 25 located in the accommodating space 3 can be cooled to 200° C. or less also by flowing nitrogen or argon gas as the purge gas into the small gap A.

Figure 2:
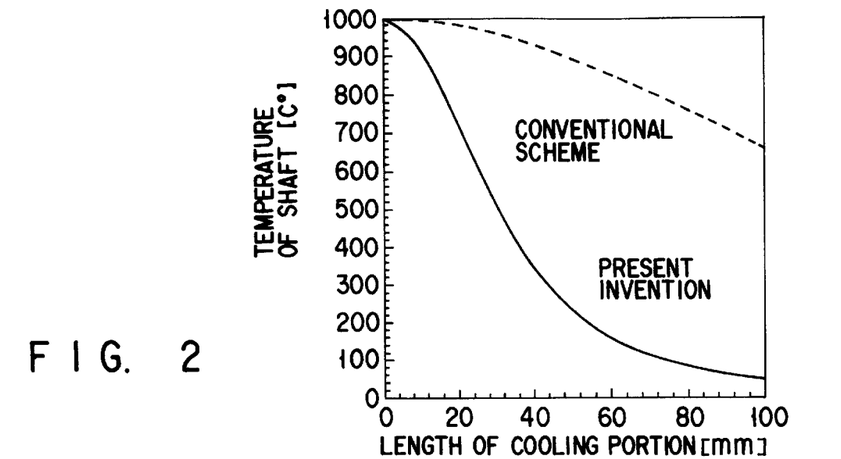
FIG. 2 is a graph showing the relationship between the temperature of the shaft and the length of the cooling portion of this apparatus in comparison with the relationship of a conventional apparatus.

FIG. 2 shows the result obtained from comparison between the shaft temperature and the length of the cooling portion of the cooling scheme of the present invention and the conventional cooling scheme. In the cooling scheme of the present invention, the hollow large-diameter portion 26 is provided as the intermediate portion of the rotating shaft 25 in the axial direction, and the coolant channel 32 is provided around the hollow large-diameter portion 26 through the small gap A. Heat is absorbed from the hollow large-diameter portion 26 by the cooling water flowing in the coolant channel 32. In the conventional scheme, merely the length of the rotating shaft is increased so that heat will not be easily transferred.

As is seen from FIG. 2, when the temperature of the heat input end is 1,000° C., in the conventional scheme, the temperature of the shaft is 600° C. or more even if the measurement portion is away from the heat input end by 100 mm. In contrast to this, with the structure of the present invention, the temperature of the shaft can be decreased to about 200° C. when the measurement portion is away from the heat input end by 50 mm. Therefore, when the structure of the present invention is employed, the magnetic bearing 34 and the motor 35 can be prevented from being exposed to a high temperature without increasing the axial length of the rotating shaft 25.

Figure 3:
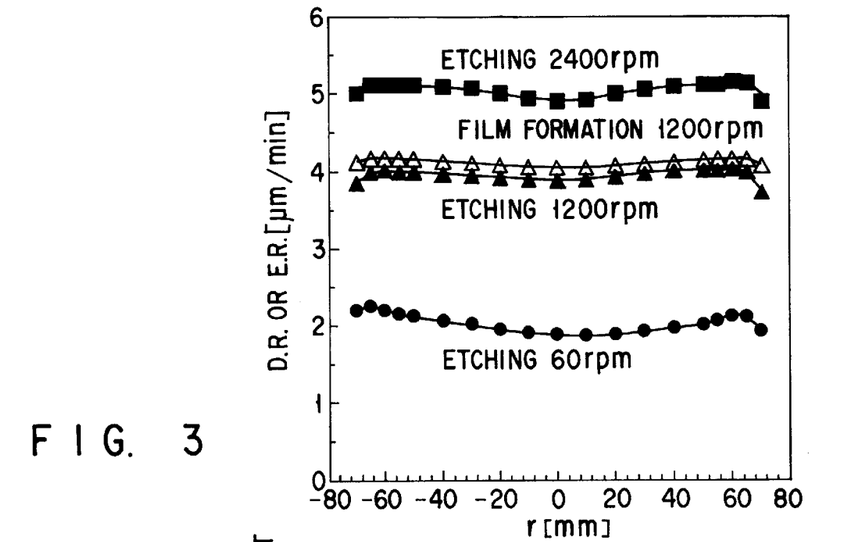
FIG. 3 is a graph showing the planar uniformity measured when substrates are processed by the apparatus shown in FIG. 1.

Since the bearing and the motor can be prevented from being exposed to a high temperature in this manner, generation of a pollutant from the bearing and the motor can be prevented, thus forming a high-quality film. More specifically, by employing the apparatus shown in FIG. 1, maintaining the temperature of the silicon wafer as the target substrate S at 700° C., and supplying $SiH_4$ as the source gas, a polysilicon film was formed on the surface of the silicon wafer. A high-quality film free from carbon contamination was obtained. When silicon was epitaxially formed by maintaining the temperature of the silicon wafer as the target substrate at 1,100° C. and supplying $SiH_2Cl_2$ as the source gas, no contamination with a metal or an organic substance was observed in the wafer. When silicon was etched by maintaining the temperature of the silicon wafer as the target substrate S at 1,100° C. and supplying HCl as the etching gas, no contamination was observed in the wafer. Epitaxial growth and etching were performed by increasing the rotation speed of the substrate holder 20 from 60 rpm to 2,400 rpm, and the planar uniformity of a 6-inch wafer was examined. As shown in FIG. 3, a good uniformity was obtained when the rotation speed was 1,200 rpm or more. Also, when the rotation speed was increased, the film formation rate and the etching rate were confirmed to be increased.

In this manner, when the structure of the present invention is employed, the reproducibility of film formation becomes better, maintenance of the rotary portion becomes almost unnecessary, and the throughput can be increased.

Figure 4:
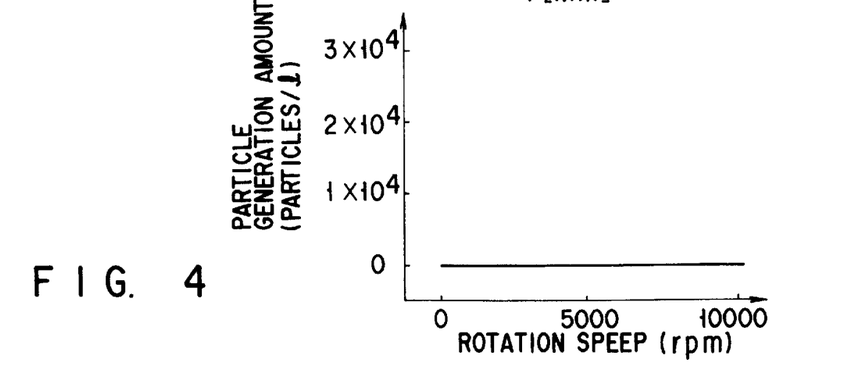
FIG. 4 is a graph showing the actually measured amount of particles generated by a magnetic bearing incorporated in the apparatus shown in FIG. 1.

When the magnetic bearing 34 is used as the bearing, as in the apparatus shown in FIG. 1, the rotary portion can be supported in a complete non-contact manner. Thus, particles or oil mist will not be generated, leading to a more preferable result. FIG. 4 shows a result obtained by measuring the amount of particles of 0.2 μm or more generated from the bearing portion. When a mechanical bearing is employed, the bearing must be replaced or lubricated periodically. However, when a magnetic bearing is employed, maintenance is unnecessary for 2 or more years. When a mechanical bearing is employed, if the rotation speed is, e.g., 10,000 rpm or more or the diameter of the rotating shaft is 40 mm or more, the peripheral speed of the rotating shaft is increased. Thus, the lubricating oil must be selected with a sufficient consideration. When, however, a magnetic bearing is employed, it can be rotated stably even if its rotation speed is 10,000 rpm or the diameter of the rotating shaft is 40 mm or more.

Both the first and second schemes of the present invention are applied to the embodiment shown in FIG. 1. The first scheme is realized by the hollow large-diameter portion 26. T0, Tw, L, $C=\{\lambda g/(\lambda w \cdot t \cdot \delta)\}^{0.5}$, $\lambda g$, $\lambda w$, t, R and δ of the second scheme can be:

R: 0.028 m
$\lambda w$: 21 W/mK (Stainless steel)
t: 0.002 m
L: 0.025 m
$\lambda g$: 0.39 W/mK (Hydrogen)
δ: 0.001 m
C: 96 m$^{-1}$
T: =160° C. When T0 and Tw are as follows;
  T0=800° C., Tw=25° C.

Figure 5:
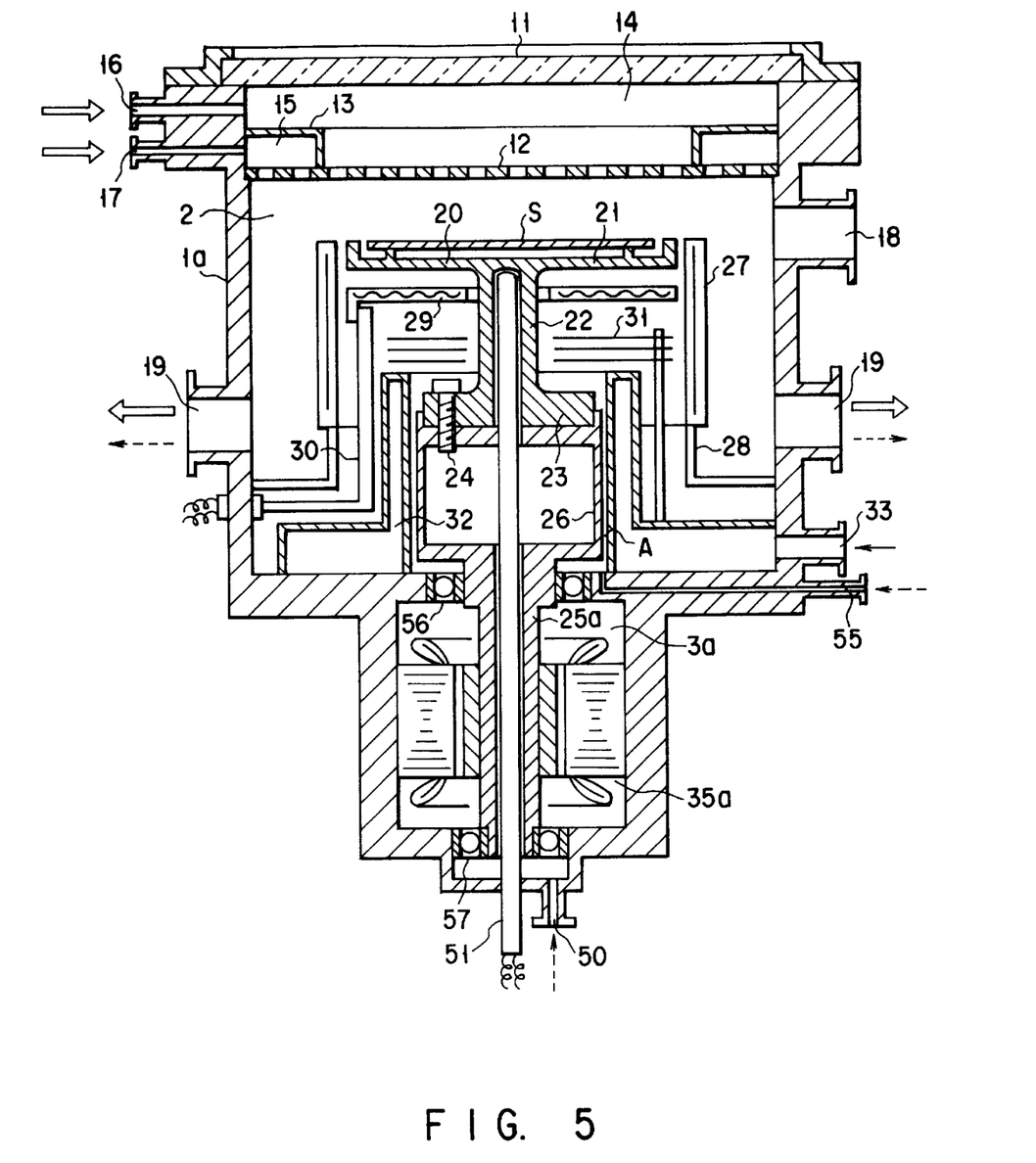
FIG. 5 is a schematic longitudinal sectional view of a substrate processing apparatus according to another embodiment of the present invention.

FIG. 5 is a schematic longitudinally sectional view of a substrate processing apparatus according to another embodiment of the present invention. In FIG. 5, functional portions almost identical to those in FIG. 1 are denoted by the same reference numerals, and a detailed description of the overlapping portions will be omitted.

The substrate processing apparatus shown in FIG. 5 uses ball bearings 56 and 57 as bearings.

This substrate processing apparatus also employs the cooling scheme in which a hollow large-diameter portion 26 is provided as an intermediate portion of a rotating shaft 25a in the axial direction, a coolant channel 32 is provided around the hollow large-diameter portion 26 through a small gap A, and heat is absorbed from the hollow large-diameter portion 26 by cooling water flowing in the coolant channel 32. Thus, even when the temperature of a substrate holder 20 is about 1,000° C., the temperature of portions of the shaft where the ball bearings 56 and 57 are located can be easily suppressed to 200° C. or less.

Therefore, the number of times of maintenance of the rotary portion can be greatly decreased in the same manner as in the apparatus shown in FIG. 1, thereby increasing the throughput.

Both the first and second schemes of the present invention are applied to the embodiment shown in FIG. 5. The first scheme is realized by the hollow large-diameter portion 26. T0, Tw, L, $C=\{\lambda g/(\lambda w \cdot t \cdot \delta)\}^{0.5}$, $\lambda g$, $\lambda w$, t, R and δ of the second principle can be:

R: 0.028 m
$\lambda w$: 210 W/mK (Alloy of aluminum)
t: 0.003 m
L: 0.060 m
$\lambda g$: 0.23 W/mK (Helium)
δ: 0.0005 m
C: 27 m$^{-1}$
T: =170° C. When T0 and Tw are as follows;
  T0=400° C., Tw=25° C.

Figure 6:
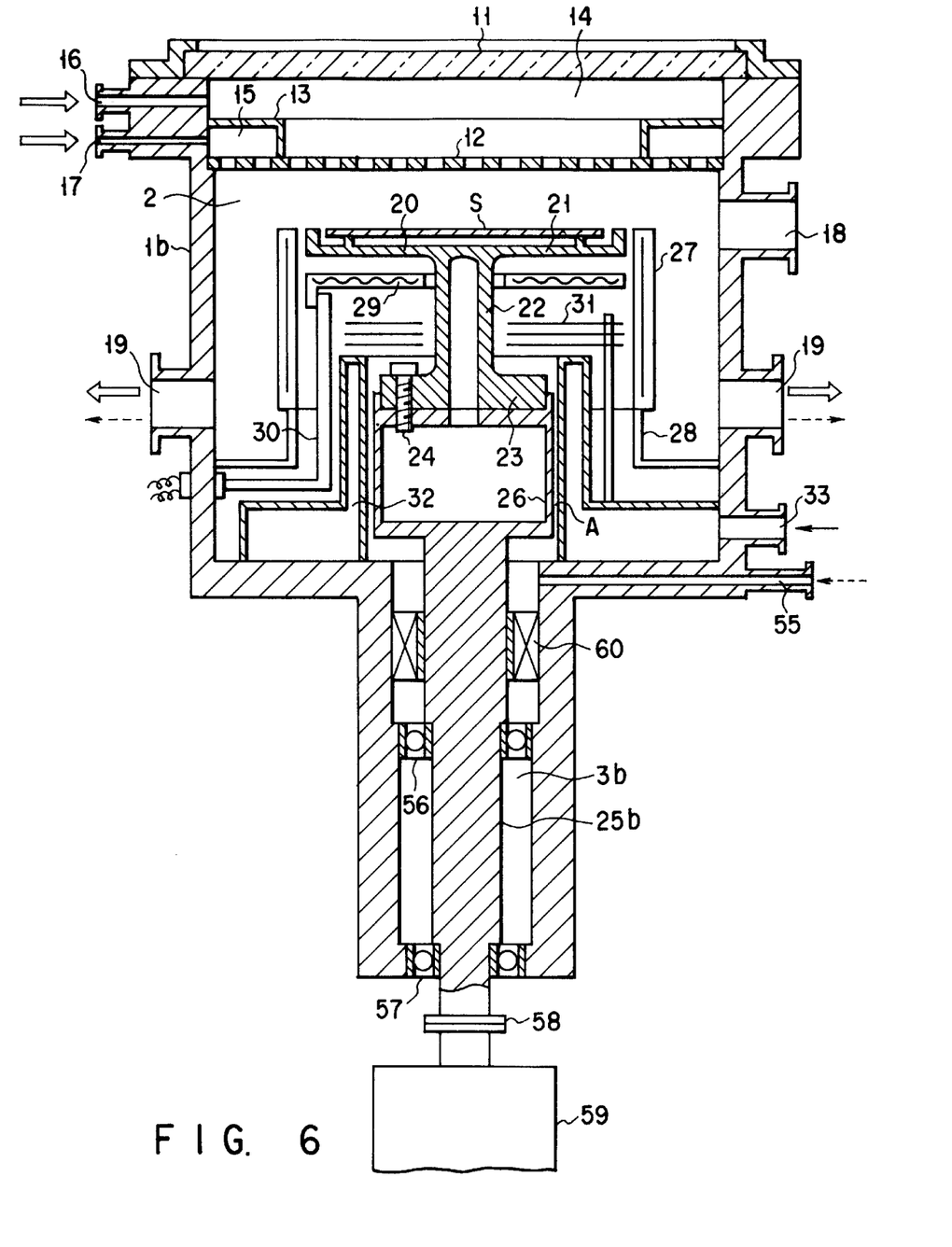
FIG. 6 is a schematic longitudinal sectional view of a substrate processing apparatus according to still another embodiment of the present invention.

FIG. 6 is a schematic longitudinal sectional view of a substrate processing apparatus according to still another embodiment of the present invention. In FIG. 6, functional portions almost identical to those in FIGS. 1 and 5 are denoted by the same reference numerals, and a detailed description of the overlapping portions will be omitted.

In the substrate processing apparatus shown in FIG. 6, the lower end side of a rotating shaft 25b projects outside a processing vessel 1b, and this outward projecting portion is coupled to the rotating shaft of a motor 59 through a coupling 58. Between a hollow large-diameter portion 26 and a ball bearing 56, a magnetic fluid seal 60 is provided between the outer circumference of the rotating shaft 25b and a wall constituting an accommodating space 3b.

More specifically, in this substrate processing apparatus, the motor 59 for supplying a rotational drive force to the rotating shaft 25b is arranged outside the processing vessel 1b, and sealing which is required due to this arrangement is achieved by the magnetic fluid seal 60.

This substrate processing apparatus also employs the cooling scheme in which the hollow large-diameter portion 26 is provided as an intermediate portion of the rotating shaft 25b in the axial direction, a coolant channel 32 is provided around the hollow large-diameter portion 26 through a small gap A, and heat is absorbed from the hollow large-diameter portion 26 by cooling water flowing in the coolant channel 32. Thus, even when the temperature of a substrate holder 20 is about 1,000° C., the temperature of a portion of the shaft where the magnetic fluid seal 60 is provided can be easily suppressed to 70° C. or less. Accordingly, contamination caused by evaporation of the magnetic fluid can be prevented, and a decrease in service life of the magnetic fluid seal 60 can be prevented.

Therefore, the number of times of maintenance of the rotary portion can be greatly decreased in the same manner as in the apparatuses shown in FIGS. 1 and 5, thereby improving the throughput. In this embodiment, since the motor 59 can be provided outside the processing vessel 1b, maintenance of the motor 59 can be facilitated.

Both the first and second schemes of the present invention are applied to the embodiment shown in FIG. 6. The first scheme is realized by the hollow large-diameter portion 26. T0, Tw, L, C=$\{\lambda g/(\lambda w \cdot t \cdot \delta)\}^{0.5}$, $\lambda g$, $\lambda w$, t, R and $\delta$ of the second scheme can be:

R: 0.028 m $\lambda w$: 1.4 W/mK (Quartz)

t: 0.005 m

L: 0.003 m $\lambda g$: 0.026 W/mK (Nitrogen)

$\delta$: 0.001 m

C: 61 $m^{-1}$

T: =160° C. When T0 and Tw are as follows;

T0=400° C., Tw=25° C.

Figure 7:
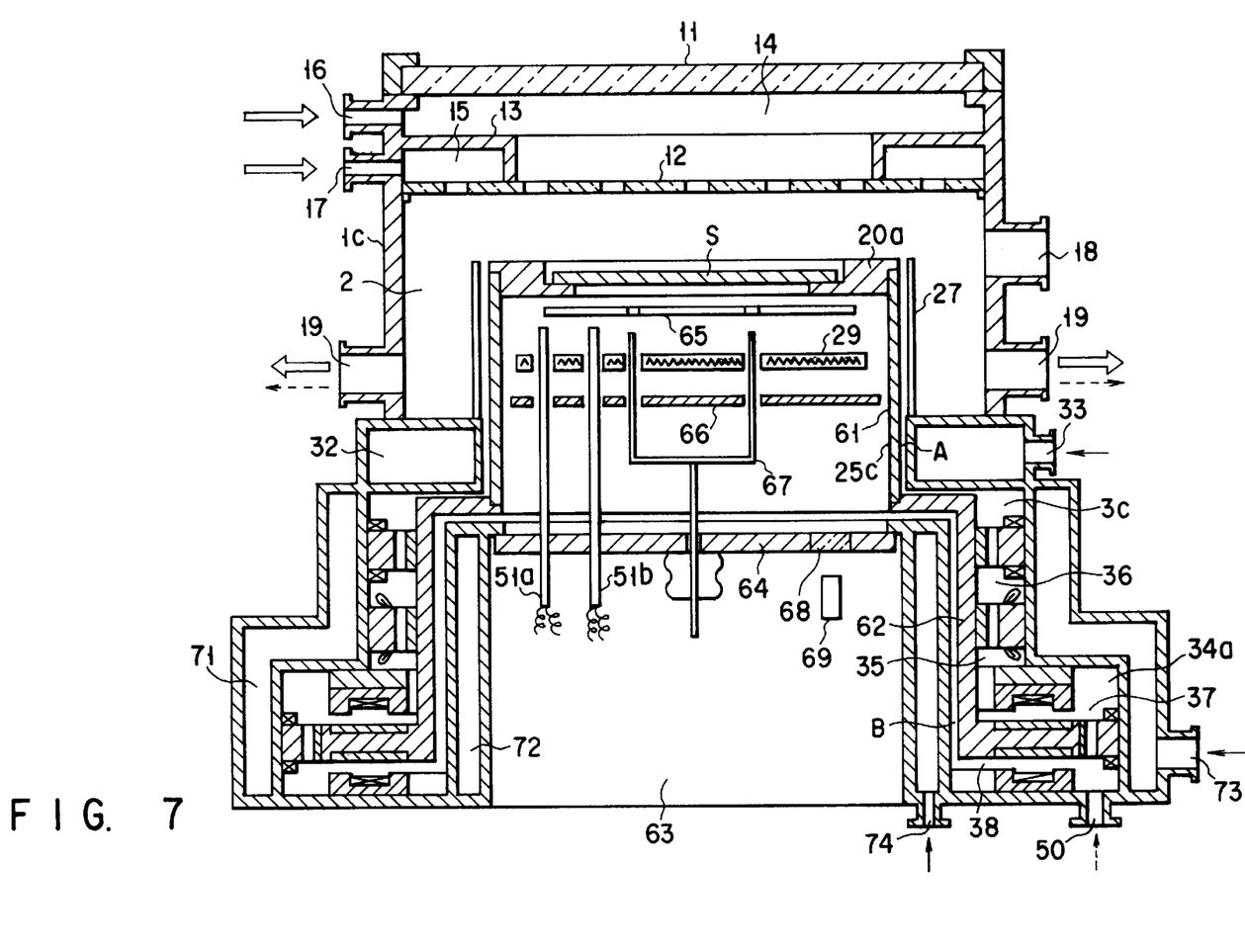
FIG. 7 is a schematic longitudinal sectional view of a substrate processing apparatus according to still another embodiment of the present invention.

FIG. 7 is a schematic longitudinal sectional view of a substrate processing apparatus according to still another embodiment of the present invention. In FIG. 7, functional portions almost identical to those in FIG. 1 are denoted by the same reference numerals, and a detailed description of the overlapping portions will be omitted.

This substrate processing apparatus also employs the same rotating shaft cooling scheme as that of the apparatus shown in FIG. 1. This substrate processing apparatus is different from that shown in FIG. 1 in that an electric heater 29 serving as the heating source and thermocouples 51a and 51b for temperature measurement are arranged in a rotating shaft 25c, and maintenance of the electric heater 29 and thermocouples 51a and 51b are facilitated. When the heating source is arranged in the rotating shaft 25c, the influence of heat which is lost as it is transferred through the rotating shaft 25c can be decreased, so that heat in a target substrate S can be uniformed easily. On the other hand, however, as the heating source is arranged in the rotating shaft 25c, assembly and maintenance become complicated, and the rotation characteristics of the rotary portion can be easily decreased.

In the substrate processing apparatus of FIG. 7, these problems are solved so that the heating source can be arranged in the rotating shaft 25c.

In this substrate processing apparatus, the rotating shaft 25c is formed hollow to have a diameter larger than that of a substrate holder 20a. More specifically, the rotating shaft 25c is constituted by shaft elements 61 and 62. One end side of the shaft element 61 is connected to the substrate holder 20a, and the other end side thereof has the same diameter as that of the substrate holder 20a and extends downward. The shaft element 62 has a larger diameter than that of the shaft element 61. One end side of the shaft element 62 is connected to the lower end of the shaft element 61, and the other end side thereof is inserted in an accommodating space 3c of a processing vessel 1c.

Around the lower portion of the shaft element 61, a coolant channel 32 is arranged to oppose it through a small gap A of about 1 mm. Cooling water of about 25° C. is guided into the coolant channel 32 through an inlet port 33 and is discharged through a discharge port (not shown).

The accommodating space 3c has an annular shape. More specifically, when the rotating shaft 25c has the above arrangement, the accommodating space 3c can have an annular shape, so that a vertically extending hollow space 63 having a larger diameter than that of the substrate holder 20a can be present at the central portion of the lower portion of the processing vessel 1c. The hollow space 63 and a processing chamber 2 are divided by a detachable base plate 64. The electric heater 29 serving as the heating source, a heat-uniforming plate 65, a heat-insulating plate 66, thermocouples 51a and 51b, and a pin 67 are mounted to the base plate 64. The pin 67 pushes up a target substrate S during loading/unloading the target substrate S.

In FIG. 7, reference numerals 71 and 72 denote coolant channels. Cooling water is flowed to the coolant channel 71 during operation to directly, forcibly cool the stationary elements of a magnetic bearing 34a and a motor 35. The coolant channel 72 indirectly cools the shaft element 62 through a small gap B. Reference numerals 73 and 74 denote inlet ports for guiding the cooling water to the coolant channels 71 and 72, respectively. In FIG. 7, touch-down bearings are not illustrated.

With the above arrangement, since the electric heater 29 serving as the heating source is arranged in the rotating shaft 25c, the thermal efficiency can be improved, thereby thermally uniforming the target substrate S. The electric heater 29, the heat-uniforming plate 65, the heat-insulating plate 66, the thermocouples 51a and 51b, and the pin 67 can be integrally removed by removing only the base plate 64, so that maintenance is facilitated. Assembly is also facilitated, as a matter of course.

When a quartz window 68 is mounted in the base plate 64, the temperature of the lower surface of the substrate, the heat-uniforming plate, the heater, or the heat-insulating plate can be measured by a radiation thermometer 69. Since the upper surface of the substrate undergoes various types of processing operations, its emissivity changes, often causing an error in the temperature measured by the radiation thermometer. However, since the emissivity of the portions described above is almost constant, precision of temperature measurement and substrate temperature control can be improved. The material of the window is not limited to quartz, and any material can be used as far as it transmits a wavelength to be measured.

The substrate processing apparatus of this embodiment also employs the cooling scheme in which the coolant channel 32 is arranged around the lower portion of the shaft element 61 of the rotating shaft 25c through the small gap A, and heat is absorbed from the lower portion of the shaft element 61 by cooling water flowing in the coolant channel 32. Thus, even when the temperature of the substrate holder 20a is about 1,000° C., the temperature of a portion of the shaft where the magnetic bearing 34a is provided can be easily suppressed to 200° C. or less.

Therefore, the number of times of maintenance of the rotary portion can be greatly decreased in the same manner as in the apparatus shown in FIG. 1, thereby increasing the throughput.

In this embodiment, since the diameter of the rotating shaft 25c is larger than that of the above embodiments, the rigidity of the rotating shaft 25c can be improved. Then, the natural frequency of the rotary portion can be increased, thereby enabling stable rotation even in a high-speed range.

When the diameter of the rotating shaft is increased, the peripheral speed of the rotating shaft is increased. Therefore, when the rotation speed is increased, with a mechanical bearing, it becomes difficult to stably rotate the rotating shaft. However, since the magnetic bearing 34a is employed in this embodiment, the rotary portion can be rotated stably.

When the diameter of the shaft and the rotation speed are increased, centrifugal fracture of the rotating shaft, the bearing member, and elements constituting the motor poses a problem. However, centrifugal fracture will not occur as long as the apparatus is operated within a range of $\omega<0.5(\sigma/\rho r^2)^{0.5}$ where $\omega$ is the rotation speed, $\sigma$ is the allowable stress of the material, $\rho$ is the density, and r is the diameter of the shaft. It is also effective to arrange, of the elements constituting the bearing and the elements constituting the motor, only elements whose material has a low strength in the rotating shaft.

Only the second scheme of the present invention is applied to the embodiment shown in FIG. 7. T0, Tw, L, C=$\{\lambda g/(\lambda w \cdot t \cdot \delta)\}^{0.5}$, $\lambda g$, $\lambda w$, t, R and $\delta$ of the second scheme can be:

R: 0.026 m
$\lambda w$: 93 W/mK (Carbon)
t: 0.004 m
L: 0.080 m
$\lambda g$: 0.39 W/mK (Nitrogen)
$\delta$: 0.0001 m
C: 32 m$^{-1}$
T: =160° C. When T0 and Tw are as follows;
  T0=900° C., Tw=25° C.

Figure 8:
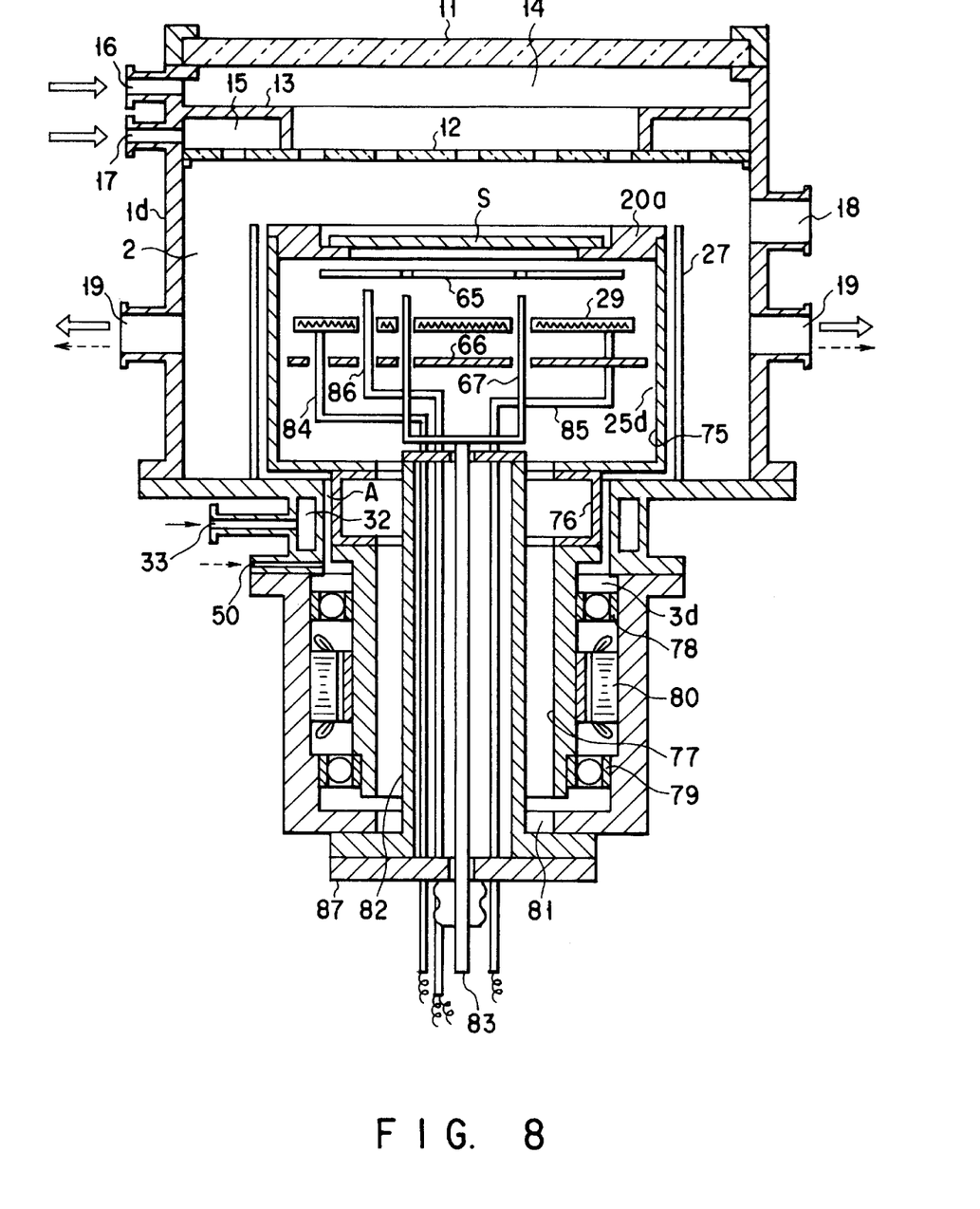
FIG. 8 is a schematic longitudinal sectional view of a substrate processing apparatus according to still another embodiment of the present invention.

FIG. 8 is a schematic longitudinal sectional view of a substrate processing apparatus according to still another embodiment of the present invention. In FIG. 8, functional portions almost identical to those in FIG. 7 are denoted by the same reference numerals, and a detailed description of the overlapping portions will be omitted.

As the rotating shaft cooling scheme, this substrate processing apparatus also employs the same scheme as that of the apparatus shown in FIG. 7. This substrate processing apparatus is different from that shown in FIG. 7 in that this apparatus uses mechanical bearings as the bearings.

In this substrate processing apparatus, a rotating shaft 25d is hollow, and its diameter is decreased downward in a stepwise manner. More specifically, the rotating shaft 25d is constituted by shaft elements 75, 76, and 77. One end side of the shaft element 75 is connected to a substrate holder 20a, and the other end side thereof has the same diameter as that of the substrate holder 20a and extends downward. The shaft element 76 has a smaller diameter than that of the shaft element 75, and its one end side is connected to the lower end of the shaft element 75. The shaft element 77 has a smaller diameter than that of the shaft element 76, and its one end side is connected to the lower end of the shaft element 76.

A coolant channel 32 is formed around the shaft element 76 to oppose it through a small gap A of about 1 mm. Cooling water of about 25° C. is guided to the coolant channel 32 through an inlet port 33, and is discharged through a discharge port (not shown).

Ball bearings 78 and 79 for rotatably supporting the rotating shaft 25d are provided between the outer circumferential surface of the shaft element 77 and the inner circumferential surface of a wall constituting an accommodating space 3d. A motor 80 for supplying a rotational power to the rotating shaft 25d is provided between the ball bearings 78 and 79.

An opening 81 is formed in the bottom portion wall of a processing vessel 1d. A protection cylinder 82 is inserted in the rotating shaft 25d through the opening 81 so as not to contact the rotating shaft 25d. A rod 83 for operating a push-up pin 67, lead wires 84 and 85 for supplying power to an electric heater 29, and a thermocouple 86 for temperature measurement are guided in the protection cylinder 82 and led to the outside while they air-tightly extend through a closing plate 87 mounted to the opening portion at the lower end of the protection cylinder 82.

The substrate processing apparatus of this embodiment also employs the cooling scheme in which the coolant channel 32 is arranged around the shaft element 76 of the rotating shaft 25d through the small gap A, and heat is absorbed from the shaft element 76 by cooling water flowing in the coolant channel 32. Thus, even when the temperature of the substrate holder 20a is about 1,000° C., the temperature of portions of the shaft where the ball bearing 78 and the motor 80 are provided can be easily suppressed to 200° C. or less.

Therefore, the number of times of maintenance of the rotary portion can be greatly decreased in the same manner as in the apparatus shown in FIG. 7, thereby increasing the throughput.

Only the second scheme of the present invention is applied to the embodiment shown in FIG. 8. T0, Tw, L, C=$\{\lambda g/(\lambda w \cdot t \cdot \delta)\}^{0.5}$, $\lambda g$, $\lambda w$, t, R and $\delta$ of the second principle can be:

R: 0.01 m
$\lambda w$: 138 W/mK (Molybdenum)
t: 0.002 m
L: 0.08 m
$\lambda g$: 0.39 W/mK (Hydrogen)
$\delta$: 0.0005 m
c: 53 m$^{-1}$
T: =44° C. When T0 and Tw are as follow;
  T0=700° C., Tw=25° C.

Figure 9:
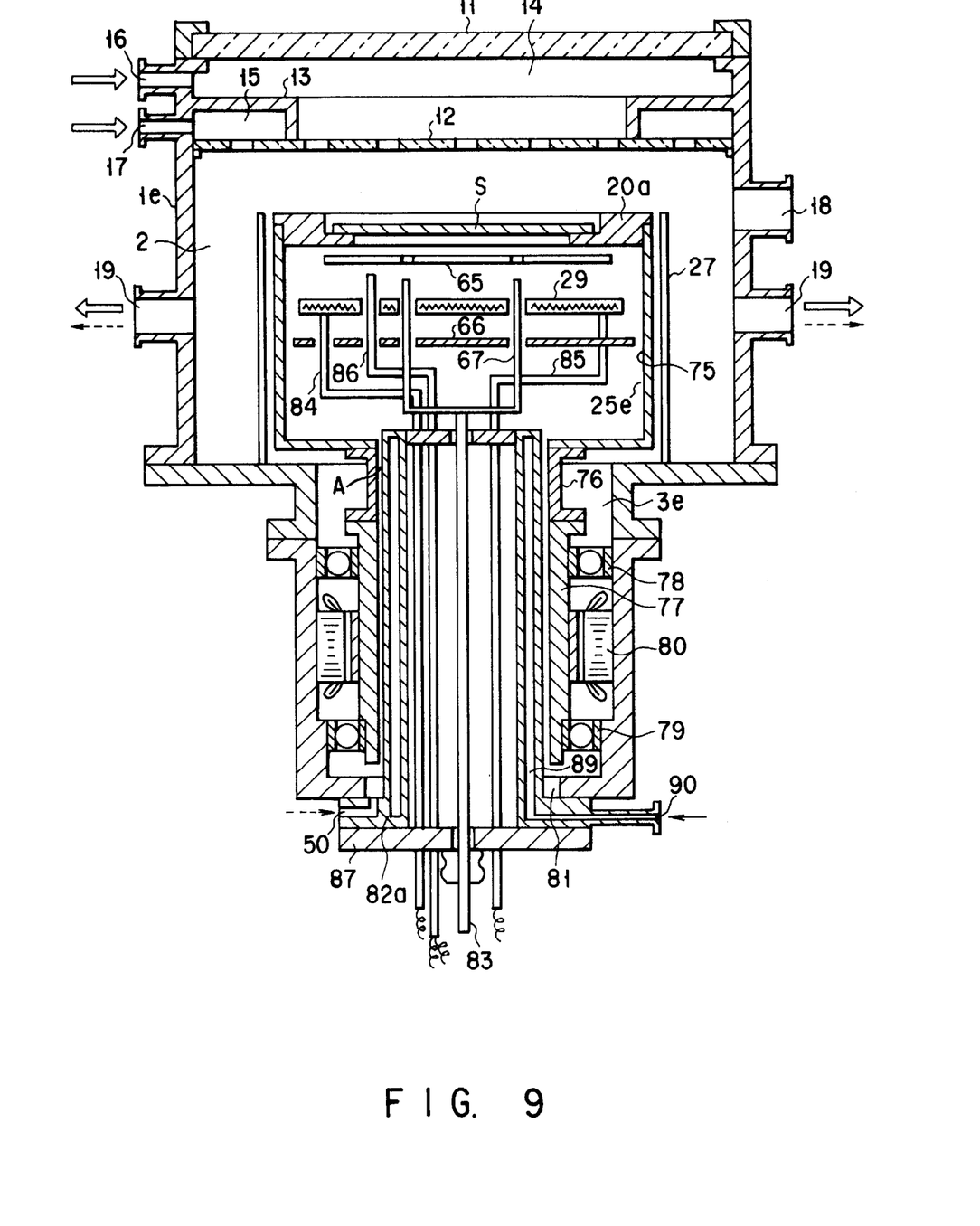
FIG. 9 is a schematic longitudinal sectional view of a substrate processing apparatus according to still another embodiment of the present invention.

FIG. 9 is a schematic longitudinal sectional view of a substrate processing apparatus according to still another embodiment of the present invention. In FIG. 9, functional portions almost identical to those in FIG. 8 are denoted by the same reference numerals, and a detailed description of the overlapping portions will be omitted.

As the rotating shaft cooling scheme, this substrate processing apparatus also employs the same scheme as that of the apparatus shown in FIG. 8. This substrate processing apparatus is different from that shown in FIG. 8 is as follows. In this apparatus, shaft elements 76 and 77 are connected to each other such that they have the same inner diameter. A protection cylinder 82a is provided inside the inner circumferential surfaces of the shaft elements 76 and 77 to be close to them with a small gap A of about 1 mm. A coolant channel 89 is formed in the circumferential wall of the protection cylinder 82a. Cooling water of about 25° C. is guided to the coolant channel 89 through an inlet port 90, and is discharged through a discharge port (not shown).

The substrate processing apparatus of this embodiment also employs the cooling scheme in which the coolant channel 89 is arranged inside the shaft elements 76 and 77 of a rotating shaft 25e through the small gap A, and heat is absorbed from the shaft elements 76 and 77 by cooling water flowing in the coolant channel 89. Thus, even when the temperature of a substrate holder 20a is about 1,000° C., the temperature of portions of the shaft where a ball bearing 78 and a motor 80 are provided can be easily suppressed to 200° C. or less.

Therefore, the number of times of maintenance of the rotary portion can be greatly decreased in the same manner as in the apparatus shown in FIG. 8, thereby increasing the throughput.

Only the second scheme of the present invention is applied to the embodiment shown in FIG. 9. T0, Tw, L, C=$\{\lambda g/(\lambda w \cdot t \cdot \delta)\}^{0.5}$, $\lambda g$, $\lambda w$, t, R and $\delta$ of the second scheme can be:

R: 0.090 m
$\lambda w$: 163 W/mK (Tungsten)

t: 0.003 m

L: 0.08 m $\lambda$g: 0.39 W/mK (Hydrogen)

$\delta$: 0.001 m c: 28 m$^{-1}$

T: =130° C. When T0 and Tw are as follows;
T0=500° C., Tw=25° C.

Figure 10:
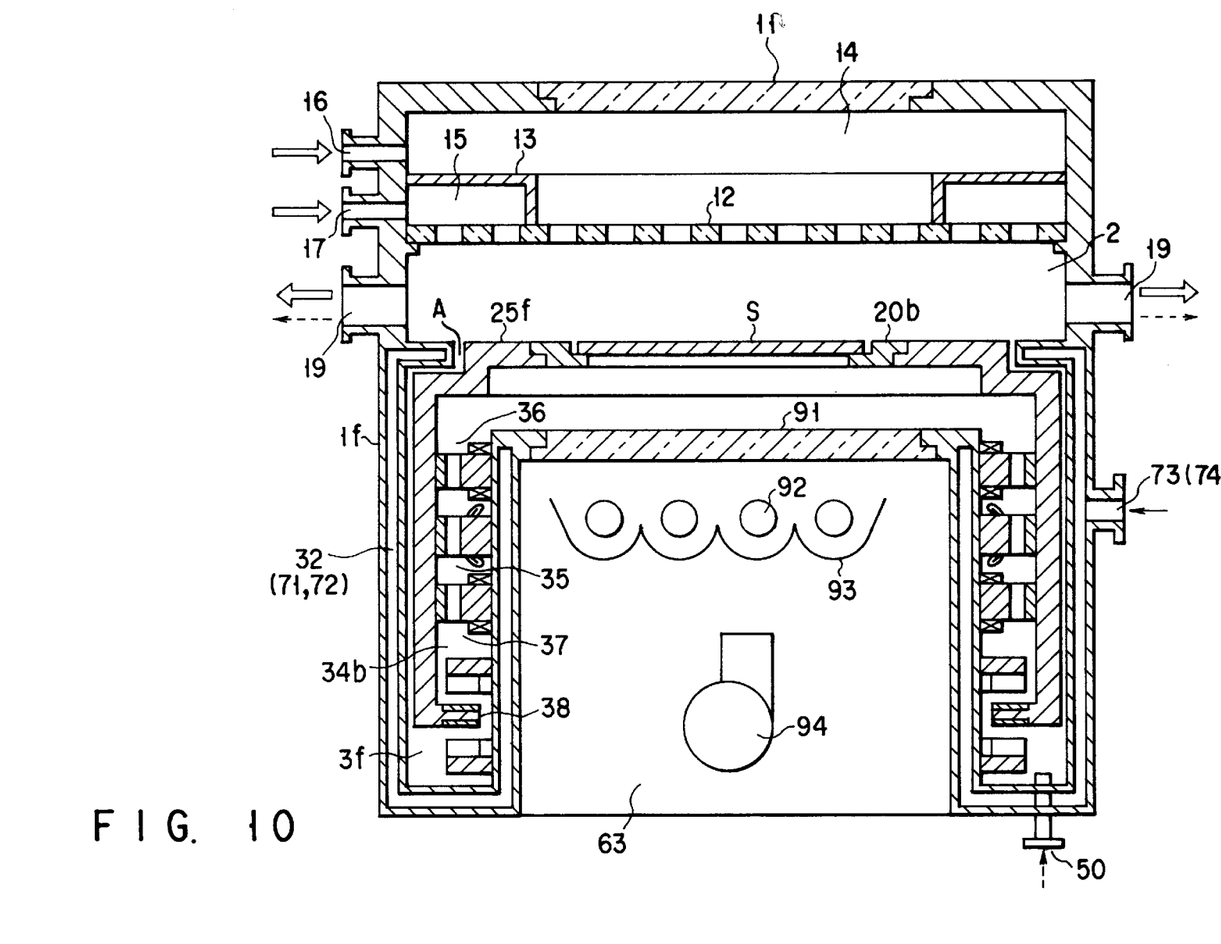
FIG. 10 is a schematic longitudinal sectional view of a substrate processing apparatus according to still another embodiment of the present invention.

FIG. 10 is a schematic longitudinal sectional view of a substrate processing apparatus according to still another embodiment of the present invention. In FIG. 10, functional portions almost identical to those in FIG. 7 are denoted by the same reference numerals, and a detailed description of the overlapping portions will be omitted.

As the rotating shaft cooling scheme, this substrate processing apparatus also employs the same scheme as that of the apparatus shown in FIG. 7. In the substrate processing apparatus of this embodiment, a quartz plate 91 is mounted in place of the base plate 64 in the embodiment shown in FIG. 7, and lamps 92 serving as a heating source are arranged below the quartz plate 91. In FIG. 10, reference numeral 93 denotes a reflecting plate; and 94, a blower for cooling the rear surface of the reflecting plate 93.

With this arrangement, the same effect as that of the embodiment shown in FIG. 7 can be obtained. Moreover, the mounting and maintenance operations of the heating source can be more facilitated than in the embodiment shown in FIG. 7. In this embodiment, of the elements constituting the bearings and the element constituting the motor, elements whose material has a low strength are arranged inside a rotating shaft 25f. Thus, centrifugal fracture of these elements can be prevented.

The present invention is not limited to the embodiments described above, but can be modified in various manners. More specifically, although a five-axis control type magnetic bearing is provided in the embodiments shown in FIGS. 1, 7, and 10, a three- or single-axis control type magnetic bearing may be incorporated. A permanent magnetic may be incorporated as the magnetic force supply source. The respective portions of the rotating shaft may be made of materials appropriate for their locations. In order to decrease the flow rate of the inert gas flowing in the small gap A, the flow resistance of the small gap channel may be increased.

Only the second scheme of the present invention is applied to the embodiment shown in FIG. 10. T0, Tw, L, C={$\lambda$g/($\lambda$w·t·$\delta$)}$^{0.5}$, $\lambda$g, $\lambda$w, t, R and $\delta$ of the second scheme can be:

R: 0.30 m $\lambda$w: 21 W/mK (Almina)

t: 0.005 m

L: 0.030 m $\lambda$g: 0.23 W/mK (Hydrogen)

$\delta$: 0.001 m c: 47 m$^{-1}$

T: =200° C. When T0 and Tw are as follow;
T0=400° C., Tw=25° C.

As has been described above, according to the present invention, the rotational drive mechanism including the bearings can be reliably protected from high temperatures without increasing the size of the apparatus. The number of times of maintenance of the rotational drive mechanism can be decreased to contribute to an increase in throughput and to execution of high-quality film formation and etching.

Additional advantages and modifications will readily occur to those skilled in the art. Therefore, the invention in its broader aspects is not limited to the specific details, representative devices, and illustrated examples shown and described herein. Accordingly, various modifications may be made without departing from the spirit or scope of the general inventive concept as defined by the appended claims and their equivalents.

What is claimed is:

1. A substrate processing method comprising the steps of:
placing a target substrate on a substrate holder in a processing vessel;
rotating a rotary member to rotate the target substrate, said rotary member being coupled to said substrate holder and having an intermediate hollow portion, said intermediate hollow portion being provided at an intermediate portion in an axial direction of said rotary member and having a larger outer diameter than a diameter of a portion coupled to said substrate holder, said intermediate hollow portion having a cylindrical surface, a first end surface, and a second end surface, the first end surface and the second end surface of the intermediate hollow portion being connected to the rotary member, wherein said cylindrical surface, said first end surface and said second end surface define said intermediate hollow portion;
heating said substrate holder to heat the target substrate;
cooling said intermediate hollow portion by cooling means through a gap, said cooling means arranged around an outside surface of said intermediate hollow portion of said rotary member; and
introducing a gas into said processing vessel to perform a processing operation to a surface of the target substrate.

2. A method according to claim 1, wherein said gas is selected from the group consisting of hydrogen, helium, nitrogen, neon, oxygen, and argon.

3. A substrate processing method comprising the steps of:
placing a target substrate on a substrate holder in a processing vessel;
rotating a rotary member coupled to said substrate holder and having an intermediate hollow portion to rotate the target substrate;
heating said substrate holder to heat the target substrate;
cooling said rotary member by cooling means through a gap, said cooling means arranged around an outside surface of said intermediate hollow portion of said rotary member, said cooling means separated from said outside surface of said intermediate hollow portion by said gap;
introducing a first gas into said processing vessel to perform a processing operation to a surface of the target substrate; and
introducing a second gas into said gap,
wherein said rotary member and the gap are set to satisfy:

$\{\lambda g/(\lambda w \cdot t \cdot \delta)\}^{0.5} > 13$ m$^{-1}$ where t is a thickness of said rotary member wall at said intermediate hollow portion represented in meters, $\lambda$w is a thermal conductivity of said intermediate hollow portion of said rotary member represented in W/mK, $\delta$ is a distance of the gap represented in meters, and $\lambda$g is a thermal conductivity of said second gas present in the gap represented in W/mK.

4. A method according to claim 3, wherein said first gas is selected from the group consisting of hydrogen, helium, nitrogen, neon, oxygen, and argon.

5. A method of processing a substrate in a processing vessel, comprising the following steps of:

placing the substrate on a holder which is connected to one end of a rotating shaft, the shaft having an intermediate hollow portion at an intermediate portion in an axial direction of said rotating shaft and having a larger diameter than a diameter of a portion coupled to said holder, the intermediate hollow portion having a cylindrical surface, a first end surface, and a second end surface, the first end and the second end surfaces of the intermediate hollow portion being connected to the shaft, wherein said cylindrical surface, said first end surface and said second end surface define said intermediate hollow portion;

rotating the other end of the rotating shaft;

heating said holder to heat the substrate;

cooling said intermediate hollow portion by using cooling means, the cooling means arranged around the intermediate hollow portion through a gap therebetween; and introducing a processing gas into said processing vessel to process the substrate.

6. A method according to claim 5, in which said heating step comprises a substep of heating said holder to heat the substrate by using a heater arranged around the shaft and between the holder and the intermediate hollow portion.

7. A method according to claim 5, in which said heating step comprises a substep of heating said holder to heat the substrate by using a heater arranged inside the intermediate hollow portion.

8. A method according to claim 5, further including the step of:

introducing a second gas into said gap; and in which said intermediate hollow portion and the gap are set to satisfy:

$$\{\lambda g/(\lambda w \cdot t \cdot \delta)\}^{0.5} > 13 \text{ m}^{-1}$$

where t is a thickness of a wall of said intermediate hollow portion represented in meters, $\lambda w$ is a thermal conductivity of said intermediate hollow portion represented in W/mK, $\delta$ is a distance of the gap represented in meters, and $\lambda g$ is a thermal conductivity of said second gas present in the gap represented in W/mK.

9. A method according to claim 5, in which said processing gas is selected from the group consisting of hydrogen, helium, nitrogen, neon, oxygen, and argon.

10. A method of processing a substrate in a processing vessel, comprising the following steps of:

placing the substrate on a holder which is connected to one end of a rotating shaft, the shaft having an intermediate hollow portion at an intermediate portion in an axial direction of said rotating shaft and having a larger outer diameter than a diameter of a portion coupled to said holder, the intermediate hollow portion having a cylindrical surface, a thickness of the cylindrical surface of the hollow portion being thinner than a thickness of remaining portions of the rotating shaft, said intermediate hollow portion having a first end surface and a second end surface, wherein said cylindrical surface, said first end surface and said second end surface define said intermediate hollow portion;

rotating the other end of the rotating shaft;

heating said holder to heat the substrate;

cooling said intermediate hollow portion by using cooling means, the cooling means arranged around the intermediate hollow portion through a gap therebetween; and introducing a processing gas into said processing vessel to process the substrate.

11. A method according to claim 10, in which said heating step comprises a substep of heating said holder to heat the substrate by using a heater arranged around the shaft and between the holder and the intermediate hollow portion.

12. A method according to claim 10, in which said heating step comprises a substep of heating said holder to heat the substrate by using a heater arranged inside the intermediate hollow portion.

13. A method according to claim 10, further including the step of:

introducing a second gas into said gap; and in which said intermediate hollow portion and the gap are set to satisfy:

$$\{\lambda g/(\lambda w \cdot t \cdot \delta)\}^{0.5} > 13 \text{ m}^{-1}$$

where t is a thickness of a wall of said intermediate hollow portion represented in meters, $\lambda w$ is a thermal conductivity of said intermediate hollow portion represented in W/mK, $\delta$ is a distance of the gap represented in meters, and $\lambda g$ is a thermal conductivity of said second gas present in the gap represented in W/mK.

14. A method according to claim 10, in which said processing gas is selected from the group consisting of hydrogen, helium, nitrogen, neon, oxygen, and argon.

15. A method of processing a substrate in a processing vessel, comprising the following steps of:

placing the substrate on a holder which is connected to one end of a rotating shaft, the shaft having an intermediate hollow portion at an intermediate portion thereof, the intermediate hollow portion having a cylindrical surface;

rotating the other end of the rotating shaft;

heating said holder to heat the substrate;

cooling said intermediate hollow portion by using cooling means, the cooling means arranged around the intermediate hollow portion through only one unoccupied gap therebetween; and introducing a processing gas into said processing vessel to process the substrate.

16. A method according to claim 15, in which said heating step comprises a substep of heating said holder to heat the substrate by using a heater arranged around the shaft and between the holder and the intermediate hollow portion.

17. A method according to claim 15, in which said heating step comprises a substep of heating said holder to heat the substrate by using a heater arranged inside the intermediate hollow portion.

18. A method according to claim 15, further including the step of:

introducing a second gas into the gap; and in which said intermediate hollow portion and the gap are set to satisfy:

$$\{\lambda g/(\lambda w \cdot t \cdot \delta)\}^{0.5} > 13 \text{ m}^{-1}$$

where t is a thickness of a wall of said intermediate hollow portion represented in meters, $\lambda w$ is a thermal conductivity of said intermediate hollow portion represented in W/mK, δ is a distance of the gap represented in meters, and λg is a thermal conductivity of said second gas present in the gap represented in W/mK.

19. A method according to claim 15, in which said processing gas is selected from the group consisting of hydrogen, helium, nitrogen, neon, oxygen, and argon.

* * * * *